METHOD OF MAKING PRINTED CIRCUITS

Filed Oct. 3, 1967

INVENTOR.
LAYTON C. KINNEY
EDWIN H. TOMKINS
LINDENBERG & FREILICH
ATTORNEYS.

United States Patent Office 3,451,813

Patented June 24, 1969

3,451,813

METHOD OF MAKING PRINTED CIRCUITS

Layton C. Kinney, Chicago, and Edwin H. Tompkins, Riverside, Ill., assignors, by mesne assignments, to Monsanto Company, St. Louis, Mo., a corporation of Delaware Continuation-in-part of application Ser. No. 316,425, Oct. 15, 1963. This application Oct. 3, 1967, Ser. No. 672,522

Int. Cl. G03c *5/00;* B44d *1/18*

U.S. Cl. 96—36.2 13 Claims

ABSTRACT OF THE DISCLOSURE

A technique for producing a printed circuit by forming a pattern of a photoflash sensitive conducting metal precursor such as silver oxide, copper oxide, nickel formate or copper powder on a substrate and photoflashing high intensity radiation for a short duration such as 0.2 to 30 milliseconds onto the pattern to convert it to a coherent conducting metal circuit adherent to the substrate. Preferably, the reaction is conducted in the presence of an oxygen excluding atmosphere to prevent oxidative recombination of the metal film. The precursor may be fusible metals, decomposable metal compounds or reducible metal compounds. The oxygen excluding atmosphere and/or the reducing agent may be provided by a photoflash pyrolyzable organic resin binder for the conducting metal precursor.

RELATED APPLICATIONS

The present application is a continuation-in-part of an application of the same title, Ser. No. 316,425, filed Oct. 15 ,1963, now abandoned, which in turn is a continuation-in-part of an application of the same title, Ser. No. 131,060, filed Aug. 14, 1961, now abandoned.

BACKGROUND OF THE INVENTION

Field of the invention

The present invention relates generally to the fabrication of printed circuits and of printed circuit components.

Description of the prior art

During the past decade, printed circuits have been accepted for widespread use and at the present writing, have important and substantial applications. They have been termed "printed circuits" or "printed electronic circuits" by those skilled in this art and both such terms are quite well known. In brief, such circuits represent a simplified substitution for the metallic wiring techniques that have been previously employed in a multitude of electrical members and components.

For a good introduction to the field of printed circuits and for a review of the prior art in this field, the reader's attention is directed to the booklet, "New Advances in Printed Circuits," which is identified as Miscellaneous Publication 192 of the United States Department of Commerce, National Bureau of Standards. As shown in this booklet, printed circuits have been produced by a multitude of procedures including those wherein a circuit configuration is deposited or formed by painting, spraying, chemical deposition, a vacuum process, die-stamping and dusting. The net result is an electrically conducting circuit formed on and adherent to an appropriate substrate. This essentially defines what is meant by the term "printed circuits."

The techniques currently available for the preparation of laminar microcircuits present serious problems. Photoresist and electrolytic etch techniques leave residues of conductive or corrosive chemical, or the resolution is not adequate. Vacuum evaporation is costly and adhesion and uniformity are problems in all methods.

Though many thermal reactions can be used to generate complex patterns, the resolution of masked or projected thermal images is extremely low with conventional heating sources. Furthermore, heat sensitive insulating substrates such as treated cardboard or paper may be decomposed or charred during a thermal circuit forming reaction.

Accordingly, an object of this invention is the provision of a rapid and dry processing technique for the production of electrically conductive, high resolution patterns on a wide variety of substrates including ceramic, plastic, and heat sensitive cellulosic materials.

These and other objects and many of the attendant advantages will become apparent as the description of the invention proceeds.

SUMMARY OF THE INVENTION

It has been discovered that by directing light energy in a brief intense pulse onto a pattern of a composition including a conducting metal or semi-conducting metal precursor that the desired electrical circuit pattern is readily achieved. Moreover, the heat profiles of the composite element are such that the circuit is formed and the energy dissipated before the substrate can be charred or decomposed. With intense, brief light flashes, the relaxation times for heat flow from the image pattern are short enough to allow resolutions comparable with those of photo chemical processes. The sharpness of the thermal image is increased considerably by the fact that the rates of the chemical reactions increase rapidly with temperature. The method has the further advantage of being free from acid etchants or other wet processing chemicals common to conventional methods.

BRIEF DESCRIPTION OF THE DRAWINGS

The invention will not be described in more detail with reference to the following detailed description considered in connection with the accompanying drawings, in which:

Referring now to FIGURE 1, a printed circuit element is prepared by coating an insulator substrate 5 of paper or the like with a pattern 7 of material containing a flash sensitive conducting metal precursor component. The pattern 7 corresponds to the desired electrical circuit configuration. An electronic flash lamp 9 within a reflector 11 is positioned over the coated substrate. By closing the switch 13, current from the power supply 15 is applied to the flash lamp 9, causing it to flash and illuminate the substrate pattern 7 with a short, intense pulse of light. The material of the pattern decomposes and forms an adherent and coherent electrically conducting circuit element 17 as shown in FIGURE 2.

Figure 1:
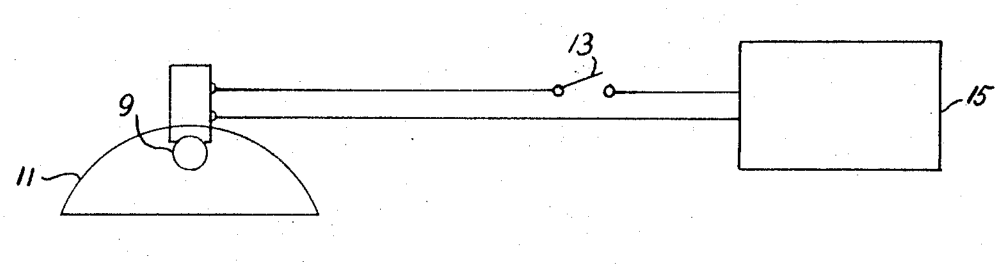
FIGURE 1 is a sectional side view schematically illustrating one arrangement for forming a printed circuit according to the invention.
Figure 1:
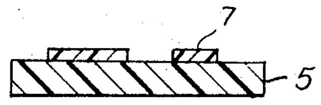
Figure 2:
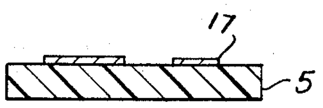
FIGURE 2 is a sectional side view of the composite after flash treatment.
Figure 3:
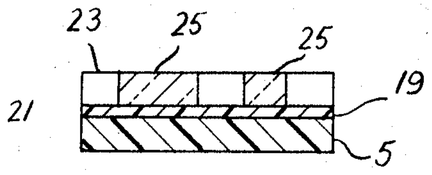
FIGURE 3 is a sectional side view schematically illustrating an alternative arrangement for forming printed circuits according to the invention.
Figure 4:
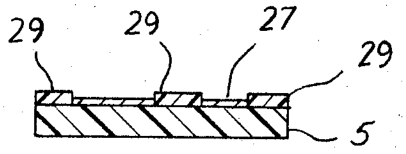
FIGURE 4 is a sectional side view of the composite of FIGURE 3 after flash treatment.
Figure 5:
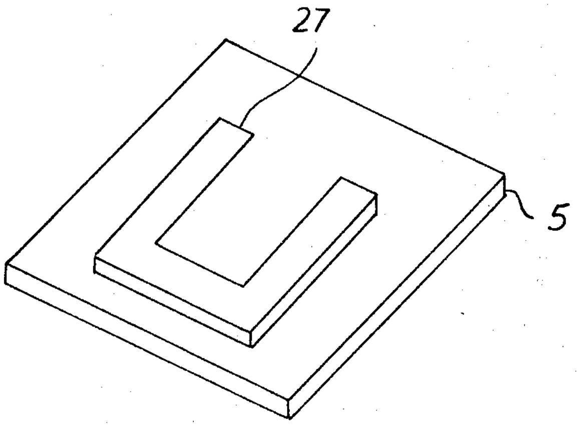
FIGURE 5 is is an isometric view of the composite of FIGURE 4 after removal of unfused precursor material.

In the embodiment shown in FIGURES 3 to 5, a substrate element 5 is completely coated with a layer 19 containing conductive metal precursor materials. A transparency mask 21 having regions 23 opaque to the flash radiation and light transmitting regions 25 in the form of the desired circuit configuration is placed on the coated substrate 5. While the transparency need not be placed in contact with the coating 19 for the purposes of the invention, sharper images are obtained by contact positioning.

When the switch 13 is closed, current flows from the power supply 15 to the flash lamp 9. A short, intense pulse of light penetrates the open regions 25 of the transparency, decomposing the exposed portions of the layer 19 forming an adherent and coherent conducting circuit pattern 27 as shown in FIGURE 4. The unreacted material 29 can then be removed by shaking, dissolution in solvent or other means to form the circuit element of FIGURE 5. In some cases, the unreacted material need not be removed as with the reduction of a nonconductive metal oxide.

While the flash may be varied as to power and duration, particularly good results have been obtained with an electronic flash of 3000 watt seconds and a millisecond duration to form an adherent and coherent conductive metal film in a pattern of very excellent resolution. It has further been found that under such conditions, heat transfer to the substrate is quite negligible and thus circuits are formed on relatively heat sensitive substrates such as paper or synthetic plastics.

According to the invention, the short, intense pulse of light from the electronic flash unit or from flashbulbs or the like is capable of inducing physical changes or chemical reactions in light absorbing films or layers of materials containing conducting metal precursors which changes are not affected by a longer pulse of equal total energy. A further characteristic of the use of short flash energy is the high degree of resolution that is obtained. The selected duration of the photoflash light is very important to the successful carrying out of the process. If the photoflash light is played on the surface for too brief an interval, it has the effect of merely heating a thin layer of the surface of the precursor deposit to an excessively high temperature. The photo-initiated decomposition and/or the fusion of the final conducting metal circuit to the substrate may be quite incomplete or superficial. Furthermore, with ultra short application of flash to layer of precursor compound material, there may result an explosive decomposition emitting gaseous byproducts disrupting the film. The energy profile may be such that the formed film vaporizes. On the other hand, if the photoflash is permitted to play on the surface for too long a duration, this results in excessive heat conduction to the substrate which may lead to burning or decomposition. The flash may be single or multiple. Also to be considered in the selection of intensity and duration of a number of flashes, is the thickness of the composite element being fabricated and the nature of the precursor material. To prepare a printed circuit with a thicker conducting film, a number of flash exposures may be required instead of merely one. With selection of a flash duration within the time limit range of between about 0.2 and 30 milliseconds, these variables may be controlled to provide coherent and adherent conducting metal circuits from the precursor materials. According to the invention, particularly good results have been obtained with a flash duration of approximately one millisecond.

It has further been found that a minimum of about one joule per square centimeter per flash of radiation within the visible and near infrared regions of the spectrum is required to produce the metal conducting circuit according to the process of the invention. To form circuits of more refractory materials, more energetic flash exposures are required. For example, platinum powders may be fused onto refractory substrates according to the invention with a flash energy input of approximately 30 joules per $cm.^2$.

Although the above has been described with reference to commercially available electronic flash units, the present process may likewise be carried out with other sources of short intense flashes of light including exploding wire sources, spark discharges or magnesium and zirconium flashbulbs. For simplicity and ease of repetition, the electronic system is preferred in the practice of the invention.

As an example of a relatively simple electronic flash unit employed in the experiments to be described, the flash lamp was xenon-filled and was fired by discharging a small capacitor through a step-up transformer connected to a third electrode placed around the flash tube. In addition, a plurality of capacitors were utilized, each of which was charged during operation to 4,000 volts or less. The light emanating from this lamp had a pulse length of about one millisecond and the flash was rated at 3,000 watt seconds.

Conducting in the sense of the electrical circuit technique of the invention is defined to include both conducting and semi-conducting patterns of material. A conducting or semi-conducting metal precursor is intended to include conducting metals, compounds thereof of combinations of compounds that are induced to decompose, fuse or react upon the stimulus of the short intense light pulse to form the desired electrical conducting circuit.

Suitable conducting metal precursors are metal powders such as copper, tin, silver, or platinum powder. A semi-conducting lead sulfide pattern can be formed from the reaction of a mixture of lead monoxide and elemental sulfur. Exemplary conducting metal precursor compounds which are converted to an adherent and coherent conducting member when subjected to flash energy are compounds of copper, lead, cadmium, nickel, silver, tin, platinum, zinc and gold. These compounds may be organic or inorganic, e.g., copper oxide, basic copper carbonate, copper hydroxide, copper salicylate, copper acetate, copper benzoate, cupric cyanide, cupric nitride, cupric oleate, copper-cupferron complex, lead oxide, zinc oxide, stannous oxide, cadmium sulfide, nickel formate, or silver oxide.

Many of the above compounds are induced to decompose and deposit conducting metal by a straight thermal effect such as copper nitrite or silver oxide. Others such as copper oxide require a reducing agent to complete the flash initiated decomposition of the compound according to the following reaction:

$$CuO \xrightarrow[\text{Agent}]{\text{Reducing}} Cu + \tfrac{1}{2}O_2$$

The reducing agent can be organic or inorganic. For example, sulfur functions as a reducing agent in the formation of lead sulfide from lead oxide and sulfur and aluminum metal powder can be utilized to reduce copper oxide. Carbon is a very effective reducing agent and can also be utilized to increase the radiation absorptivity of the precursor film, by mixing graphite carbon into the precursor composition or by applying a thin film of carbon black to the pattern of precursor composition.

Even in the instances where a reducing agent is not required to initiate the production of the conducting metal deposit, the metal may, under the thermal conditions present during photoflash treatment, be oxidized by the oxygen in the atmosphere adjacent the film supplied by air or by the decomposition reaction. This reverse combination reaction should be delayed and inhibited until the metal atoms can fuse and join into a coherent and adherent film. It is therefore desirable to conduct the reaction in an oxygen excluding atmosphere. This can be accomplished by blanketing the reaction area with an inert gas such as nitrogen or by utilizing a stoichiometric excess of reducing agent.

A convenient manner of compounding the precursor composition for coating onto the substrate is to suspend the particles of metal or conducting metal compound in an organic polymeric binder which may be dissolved or diluted with a solvent or diluent. The composition may then be applied to the substrate as an overall coating or in accordance with a predetermined pattern by conventional techniques or painting, spraying, brushing or stencilling. The coating is then dried before flash treatment.

Another important consideration is adhesion of the film. If the deposit does not adhere to the substrate under the optimum conditions described above, it can be reheated to incipient fusion while applying moderate mechanical pressure in a mildly reducing atmosphere after the unreacted compound has been removed. It may be sometimes advantageous to incorporate within the composition a suitable fluxing agent such as zinc chloride or a powdered resinous fluxing material. These materials are also of advantage when finely divided metal powders are being flash initiated to form the desired conducting metal circuit, particularly when the metal particles are coated with an oxide film.

The organic resin material discussed above not only functions as a depositional binder but can also serve as the reducing agent and/or oxygen excluding atmosphere. The resin decomposes under influence of the photoflash light to form various hydrocarbon monomeric and decomposition products to furnish oxidizable material for the reduction reaction and a non-oxidizing atmosphere inhibiting the recombination of the deposited metal with oxygen.

The energy absorbed from the flash lamp initiates the reduction of the metal compound to metal by oxidizing the carbon and hydrogen of the binder material. For example, with copper oxide and methyl methacrylate resin, theoretically this reduction is:

$$12CuO+C_5H_8O_2 \rightarrow 24Cu+4H_2O+5CO_2$$

Though only about 5 to 6% of methyl methacrylate is stoichiometrically required for complete reduction of the oxide, an excess is required in practice. This is probably due to depolymerization and loss of the monomer by volatilization since the monomer boils at a relatively low temperature of about 165° C. Acryloid B-66, an acrylic ester copolymer resin manufactured by Rohm and Haas, is found to depolymerize at higher temperatures and less resin is required for reduction as compared to methyl methacrylate. Carboxy-methylcellulose is found to be an effective binder-reducing agent as also are polyvinyl alcohol, polystyrene or polyurethanes. These compositions may be dissolved or carried in solvents such as acetone, toluene, water. The metal or compound thereof may be milled with the resin in solvent to form a uniform solution or dispersion before application to the substrate.

Another factor to be considered in determining the amount of resin and solvent is the shrinkage of the deposit. Since maximum density of the deposit is desired, as little of the binder-reducing agent in consonance with good flow and mechanical stability for deposition and reducing capability should be utilized. Resin contents of from about 5% to about 30% by weight have been found to be effective in forming printed circuit elements according to the invention. Preparations of the coatings as a compact in a press require minimal solvent and binder. The solvent is primarily required as a lubricant to aid compaction and is evaporated before the flash treatment. With highly compacted or highly reactive compositions, it may be necessary to moderate the reaction. This can be accomplished, for example, with copper oxide by adding some copper powder to the precursor composition. This has the added benefit of increasing the density as well as absorbing the excess energy from the reaction.

The invention is now illustrated by the following examples which are in no way intended to limit the invention.

EXAMPLE I

A mixture of the following was ball-milled for 24 hours:

| | | |
|---|---|---|
| Copper hydroxide | grams | 20 |
| Polymethyl methacrylate binder | do | 4 |
| Toluene | ml | 100 |

The above-milled mixture was painted onto paper in a desired circuit pattern and permitted to dry in air. After thorough drying to remove residual solvent, the coating in the air was subjected to photoflash energy from a 10,000 watt second source at 3200 to 3900 volts. Flash duration was of the order of 2 milliseconds. Usually 2 to 3 flashes are required to produce maximum conductivity. A metallic copper deposit was produced having a conductivity value of approximately 2 ohms/cm.$^2$, and the paper substrate was not harmed by the effects of the photoflash treatment.

When copper hydroxide was substituted with copper acetate, copper salicylate, cupric oxide or basic cupric carbonate [$CuCO_3$—$Cu(OH)_2$—$H_2O$] an adherent and coherent conducting copper circuit was found in each instance. The experiment was repeated, replacing the binder with Acryloid B-66, an acrylic ester copolymer resin manufactured by Rohm and Haas. Lesser amounts of this resin can be utilized to completely reduce the copper hydroxide as compared to methyl methacrylate.

EXAMPLE II

The following mixture was processed according to the procedure of Example 1 to produce a metallic copper printed circuit:

| | | |
|---|---|---|
| Cupric hydroxide | grams | 20 |
| Carboxy-methylcellulose | do | 3.6 |
| Water | ml | 100 |

When one gram of carbon black was added to the mixture of Example II, denser and thicker copper deposits were more readily obtained.

EXAMPLE III

Copper nitride moderated with copper powder was coated onto a ceramic substrate and was in turn coated with a very thin coating of carbon black. The composite was photoflash initiated according to the procedure of Example I to produce a copper circuit.

EXAMPLE IV

Silver oxide was compounded with about 2% by weight based on the oxide of polyvinyl alcohol. The reaction mixture was photoflash initiated according to the procedure of Example I to produce a silver circuit. This is less than a stoichiometric amount of binder. However, silver oxide decomposes to silver and oxygen and the sIlver does not reoxidize under these conditions. However, molten silver absorbs oxygen in large volumes and on solidification, this oxygen is given off rapidly. This leads to spitting. The atmosphere provided by the resin decomposition gasses reduces spitting as does blanketing the surface with nitrogen.

EXAMPLE V

The following mixture was ball-milled for 24 hours, painted onto paper in a desired pattern, air dried and flashed at 3000 watt seconds for one millisecond:

| | | |
|---|---|---|
| Nickel formate | grams | 20 |
| Acryloid B-66 | do | 4 |
| Lampblack | do | 1 |
| Toluene | cc | 50 |

A conductive nickel film strongly adherent to the substrate resulted. The paper substrate was not charred or decomposed by the treatment.

EXAMPLE VI

The following mixture was milled, deposited and flashed in the same manner as Example I above to produce a silver circuit pattern:

| | | |
|---|---|---|
| Silver oxide, $Ag_2O$ | grams | 20 |
| Acryloid B-66 | do | 4 |
| Toluene | cc | 50 |

EXAMPLE VII

Copper powder of an ultra fine particle size range of from 7.5 to 75 microns was dusted on a polypropylene substrate in the desired circuit configuration. The sample was then subjected to photoflash energy according to the procedure of Example I to yield a printed circuit.

The conducting and semi-conducting metal precursor materials may be applied to a variety of substrates, particularly when a binder is utilized. With the fusible metal powders, it is preferred that a thermoplastic substrate be employed to facilitate bonding of the resulting printed circuit element to the substrate.

The present process may be conducted in air even though carried out in the presence of intense energy. Furthermore, highly resolved deposition in printed circuit form can be caused to readily occur on substrates that are quite heat sensitive.

What is claimed is:

1. A method of producing an electrical printed circuit element on an electrically insulating substrate comprising the steps of:

forming on a surface of said substrate a printed circuit pattern of a photoflash pyrolyzable organic resin binder containing a conducting metal precursor selected from the group consisting of photoflash decomposable conducting metal compounds, photoflash reducible conducting metal compounds and conducting metals, said resin binder containing precursor yielding a conducting metal on the stimulus of photoflash energy and said binder being present in the proportions of 5 to 30% by weight; and photoflashing high intensity energy of at least one joule per square centimeter for a short duration onto the pattern and converting said pattern into a coherent conducting metal circuit adherent to said substrate.

2. A method according to claim 1 wherein the conducting metal is selected from copper, tin, silver, platinum, lead, cadmium, nickel, zinc and gold.

3. A method according to claim 2 wherein the conducting metal precursor is selected from oxides, hydroxides, sulfides, carbonates, salicylates, acetates, benzoates, cyanides, nitrides, oleates, and formates, of a conducting metal.

4. A method according to claim 1 wherein said resin is selected from acrylic, styrene, urethane, vinyl alcohol and cellulosic resins.

5. A method according to claim 1 in which the pattern is formed by depositing said binder onto the substrate in the desired printed circuit configuration.

6. A method according to claim 1 in which the pattern of material is formed by depositing said material onto the substrate, positioning a light absorbing mask having an open pattern in the desired configuration in front of the deposit and flashing the high intensity photoflash energy through said open pattern onto said deposit.

7. A method according to claim 1 wherein said photoflash duration is from about 0.2 to about 30 milliseconds.

8. A method of manufacturing a printed electrical circuit element comprising the steps of:

photoflashing high intensity energy of at least one joule per square centimeter for about 0.2 to 30 milliseconds onto a pattern of a photoflash sensitive precursor of an electrically conducting metal coated onto an electrically insulating substrate; and forming a coherent electrically conducting metal pattern adherent to the substrate.

9. A method according to claim 8 in which an oxygen excluding atmosphere is present on the surface of the substrate during the photoflash treatment.

10. A method according to claim 9 in which the atmosphere is reducing.

11. A method according to claim 9 in which the conducting metal precursor is dispersed in a photoflash pyrolyzable organic binder which decomposes to form said oxygen excluding atmosphere.

12. A method according to claim 11 in which 5 to 30% by weight of the resin binder is initially present.

13. A method according to claim 11 in which said resin decomposition products are a reducing agent for a reducible conducting metal precursor.

References Cited

UNITED STATES PATENTS

| | | | |
|---|---|---|---|
| 1,939,232 | 12/1933 | Sheppard et al. | 117—34 |
| 2,019,737 | 11/1935 | Sheppard et al. | 117—36.8 |
| 2,698,812 | 1/1955 | Schladitz | 117—107.2 X |
| 2,914,404 | 11/1959 | Fansleau et al. | 117—93.3 X |
| 2,987,456 | 6/1961 | Lauer | 204—157.1 |
| 3,056,881 | 10/1962 | Schwartz | 117—93.3 |
| 3,234,044 | 2/1966 | Andes et al. | 117—93.3 |
| 3,347,702 | 10/1967 | Claney | 117—34 |

ALFRED L. LEAVITT, *Primary Examiner.*

ALAN GRIMALDI, *Assistant Examiner.*

U.S. Cl. X.R.

117—34, 93.3, 212; 174—68.5; 252—501